United States Patent [19]
Ma et al.

[11] Patent Number: 6,063,828
[45] Date of Patent: *May 16, 2000

[54] UNDERFILL ENCAPSULANT COMPOSITIONS FOR USE IN ELECTRONIC DEVICES

[75] Inventors: Bodan Ma, Weehawken; Quinn K. Tong, Belle Mead, both of N.J.

[73] Assignee: National Starch and Chemical Investment Holding Corporation, Wilmington, Del.

[ * ] Notice: This patent is subject to a terminal disclaimer.

[21] Appl. No.: 09/110,047

[22] Filed: Jul. 2, 1998

[51] Int. Cl.[7] ............................ C08F 2/46; C08F 267/10; C08G 2/46; C08K 3/00
[52] U.S. Cl. ............................... 522/96; 522/99; 522/90; 522/104; 522/107; 522/148; 522/156; 525/282; 523/400; 523/435; 548/521
[58] Field of Search ........................... 522/104, 96, 99, 522/90, 107, 148, 156; 523/400, 435; 525/282; 548/521

[56] References Cited

U.S. PATENT DOCUMENTS

| | | | |
|---|---|---|---|
| 4,311,636 | 1/1982 | Hahn et al. | 260/45.8 |
| 4,336,311 | 6/1982 | Lucey | 428/521 |
| 4,485,218 | 11/1984 | Bell | 525/257 |
| 4,533,975 | 8/1985 | Bill | 361/323 |
| 4,613,637 | 9/1986 | Landis et al. | 524/105 |
| 4,623,559 | 11/1986 | Hudock | 427/54.1 |
| 4,720,445 | 1/1988 | Brahim et al. | 430/192 |
| 4,826,995 | 5/1989 | Alexander et al. | 548/521 |
| 4,876,358 | 10/1989 | Alexander | 548/521 |
| 4,980,436 | 12/1990 | Saito et al. | 526/261 |
| 4,999,136 | 3/1991 | Su | 252/512 |
| 5,017,406 | 5/1991 | Lutz | 427/54.1 |
| 5,137,936 | 8/1992 | Akiguchi | 522/170 |
| 5,258,426 | 11/1993 | Uchida et al. | 523/435 |
| 5,272,377 | 12/1993 | Shimozawa | 257/787 |
| 5,314,950 | 5/1994 | Singh et al. | 525/73 |
| 5,347,258 | 9/1994 | Howard et al. | 338/333 |
| 5,426,008 | 6/1995 | Hagiwara | 430/18 |
| 5,532,296 | 7/1996 | Recker et al. | 523/400 |
| 5,602,205 | 2/1997 | Singh et al. | 525/282 |
| 5,627,222 | 5/1997 | Recker et al. | 523/400 |
| 5,726,391 | 3/1998 | Iyer et al. | 174/52.2 |
| 5,760,337 | 6/1998 | Iyer et al. | 174/52.2 |
| 5,863,664 | 1/1999 | McCormick et al. | 428/500 |

FOREIGN PATENT DOCUMENTS

| | | |
|---|---|---|
| 0 051 165 | 5/1982 | European Pat. Off. ........ H01L 23/14 |
| 0 357 110 | 3/1990 | European Pat. Off. ...... C09D 151/00 |
| 475 655 A2 | 3/1992 | European Pat. Off. . |
| 1-152174 | 6/1989 | Japan . |
| 4-146984 | 5/1992 | Japan . |
| 96/07691 | 3/1996 | WIPO . |
| 97/18254 | 5/1997 | WIPO . |

OTHER PUBLICATIONS

Mark A. Smith et al., "Bismalemide/Vinyl Ether Matrix Copolymers", Department of Chemistry and Center for Macromolecular Science and Engineering, Univ. of Florida, Gainesville, FL (2 pgs.). Yr. not Available.

Carol K. Sauers, "The Dehydration of N–Arylmaleamic Acids with Acetic Anhydride", The Journal of Organic Chemistry, vol. 34, No. 8, Aug. 1969, pp. 2275–2279.

Robert J. Cotter et al., "The Synthesis of N–Substituted Isomaleimides", vol. 26, Jan. 1961, pp. 10–15.

*Primary Examiner*—James J. Seidleck
*Assistant Examiner*—Sanza L. McClendon
*Attorney, Agent, or Firm*—Jane E. Gennaro

[57] ABSTRACT

A curable underfill encapsulant composition, suitable for use in semiconductor packaging, comprises one or more mono- or polyfunctional maleimide compounds, or one or more mono- or polyfunctional vinyl compounds other than maleimide compounds, or a combination of maleimide and vinyl compounds, with a free radical curing agent, and optionally, one or more fillers.

33 Claims, No Drawings

UNDERFILL ENCAPSULANT COMPOSITIONS FOR USE IN ELECTRONIC DEVICES

This invention was made with Government support under Prime Contract No. F33615-96-C-5117 awarded by the United States Air Force. The Government has certain rights in this invention.

FIELD OF THE INVENTION

This invention relates to underfill encapsulant compositions that are suitable for use as underfill encapsulants to protect and reinforce the interconnections between an electronic component and a substrate in a microelectronic device.

BACKGROUND OF THE INVENTION

Microelectronic devices contain millions of electrical circuit components, mainly transistors assembled in integrated circuit (IC) chips, but also resistors, capacitors, and other components. These electronic components are interconnected to form the circuits, and eventually are connected to and supported on a carrier or substrate, such as a printed wire board.

The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board.

Whether the component is a bare chip connected to a lead frame, or a package connected to a printed wire board or other substrate, the connections are made between electrical terminations on the electronic component and corresponding electrical terminations on the substrate. One method for making these connections uses metallic or polymeric material that is applied in bumps to the component or substrate terminals. The terminals are aligned and contacted together and the resulting assembly heated to reflow the metallic or polymeric material and solidify the connection.

During subsequent manufacturing steps, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent failure, the gap between the component and the substrate is filled with a polymeric encapsulant, hereinafter called underfill or underfill encapsulant, to reinforce the interconnect and to absorb some of the stress of the thermal cycling.

Two prominent uses for underfill technology are in packages known in the industry as flip-chip, in which a chip is attached to a lead frame, and ball grid array, in which a package of one or more chips is attached to a printed wire board.

The underfill encapsulation may take place after the reflow of the metallic or polymeric interconnect, or it may take place simultaneously with the reflow. If underfill encapsulation takes place after reflow of the interconnect, a measured amount of underfill encapsulant material will be dispensed along one or more peripheral sides of the electronic assembly and capillary action within the component-to-substrate gap draws the material inward. The substrate may be preheated if needed to achieve the desired level of encapsulant viscosity for the optimum capillary action. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

If underfill encapsulation is to take place simultaneously with reflow of the solder or polymeric interconnects, the underfill encapsulant, which can include a fluxing agent if solder is the interconnect material, first is applied to either the substrate or the component; then terminals on the component and substrate are aligned and contacted and the assembly heated to reflow the metallic or polymeric interconnect material. During this heating process, curing of the underfill encapsulant occurs simultaneously with reflow of the metallic or polymeric interconnect material.

For single chip packaging involving high volume commodity products, a failed chip can be discarded without significant loss. However, it becomes expensive to discard multi-chip packages with only one failed chip and the ability to rework the failed component would be a manufacturing advantage. Today, one of the primary thrusts within the semiconductor industry is to develop not only an underfill encapsulant that will meet all the requirements for reinforcement of the interconnect, but also an underfill encapsulant that will be reworkable, allowing for the failed component to be removed without destroying the substrate.

Conventional underfill technology uses low viscosity thermosetting organic materials, the most widely used being epoxy/anhydride systems. In order to achieve the required mechanical performance, relatively high molecular weight thermoplastics would be the preferred compositions for underfill materials. These materials, however, have high viscosity or even solid film form, which are drawbacks to the manufacturing process. Therefore, there is a need for new encapsulant compositions that are easily dispensable to conform with automated manufacturing processes, and that are reworkable.

SUMMARY OF THE INVENTION

This invention is a curable underfill encapsulant composition that comprises one or more compounds containing one or more maleimide functionality, or one or more compounds containing one or more vinyl functionality, or a combination of compounds containing maleimide or vinyl functionality, a free-radical initiator and/or a photoinitiator, and optionally one or more fillers.

A compound containing one maleimide functionality will be referred to hereinafter as a mono-functional maleimide compound. A compound containing more than one maleimide functionality will be referred to hereinafter as a poly-functional maleimide compound. A compound containing one vinyl functionality will be referred to hereinafter as a mono-functional vinyl compound. A compound containing more than one vinyl functionality will be referred to hereinafter as a poly-functional vinyl compound. The functionality is defined herein to be a carbon to carbon double bond.

The composition can be designed to be reworkable by choosing a major amount of mono-functional compounds for the composition.

The ability to process these compositions for underfill encapsulants is achieved by using relatively low molecular weight reactive oligomers or pre-polymers and curing them in situ after application to the electronic assembly. The relatively low molecular weight translates to a lower viscosity and ease of application to the substrate.

In another embodiment, this invention is a cured encapsulant composition that results after the curing of the just described curable underfill encapsulant composition.

In another embodiment, this invention is an electronic assembly comprising an electronic component having a plurality of electrical terminations, each termination electrically and mechanically connected by a metallic or polymeric material (the metallic or polymeric material also referred to herein as interconnect or interconnect material) to a substrate having a plurality of electrical terminations corresponding to the terminations of the electrical component, and an encapsulant disposed and then cured between the electrical component and the substrate to reinforce the solder or polymeric interconnects, in which the cured underfill encapsulant was prepared from a composition comprising one or more mono- or polyfunctional maleimide compounds, or one or more mono- or polyfunctional vinyl compounds other than maleimide compounds, or a combination of maleimide and vinyl compounds, a free radical curing agent and/or a photoinitiator, and optionally, one or more fillers.

DETAILED DESCRIPTION OF THE INVENTION

The maleimide and vinyl compounds used in the underfill encapsulant compositions of this invention are curable compounds, meaning that they are capable of polymerization, with or without crosslinking. As used in this specification, to cure will mean to polymerize, with or without crosslinking. Cross-linking, as is understood in the art, is the attachment of two polymer chains by bridges of an element, a molecular group, or a compound, and in general will take place upon heating. As cross-linking density is increased, the properties of a material can be changed from thermoplastic to thermosetting, which consequently increases polymeric strength, heat-and electrical resistance, and resistance to solvents and other chemicals.

It is possible to prepare polymers of a wide range of cross-link density, from tacky, elastomeric to tough glassy polymers, by the judicious choice and amount of mono- or polyfunctional compounds. The greater proportion of polyfunctional compounds reacted, the greater the cross-link density. If thermoplastic properties are desired, the underfill encapsulants of this invention can be prepared from monofunctional compounds to limit the cross-link density. However, a minor amount of poly-functional compounds can be added to provide some cross-linking and strength to the composition, provided the amount of poly-functional compounds is limited to an amount that does not diminish the desired thermoplastic properties. Within these parameters, the strength and elasticity of individual underfill encapsulants can be tailored to a particular end-use application.

The cross-link density can also be controlled to give a wide range of glass transition temperatures in the cured underfill to withstand subsequent processing and operation temperatures. For those underfill encapsulants that are designed to be reworkable, the Tg is chosen to be below the reflow temperature of the metallic or polymeric interconnect. If the underfill is added after the reflow of the interconnect material, the low Tg will allow the encapsulant material to soften and adhere to both the electronic component and the substrate without affecting the interconnect.

If the underfill is added before the reflow, the same effect is achieved. The underfill encapsulant will soften and adhere to the electronic component and substrate during the reflow of the interconnect material. Intimate contact is maintained with the interconnect after the interconnect solidifies, imparting good stress transfer and long-term reliability.

In those cases where it is necessary to rework the assembly, the electronic component can be pried off the substrate, and any residue underfill can be heated until it softens and is easily removed.

In the inventive underfill encapsulant compositions, the maleimide compounds and the vinyl compounds may be used independently, or in combination. The maleimide or vinyl compounds, or both, will be present in the curable underfill encapsulant compositions in an amount from 2 to 98 weight percent based on the organic components present (excluding any fillers).

The underfill encapsulant compositions will further comprise at least one free-radical initiator, which is defined to be a chemical species that decomposes to a molecular fragment having one or more unpaired electrons, highly reactive and usually short-lived, which is capable of initiating a chemical reaction by means of a chain mechanism. The free-radical initiator will be present in an amount of 0.1 to 10 percent, preferably 0.1 to 3.0 percent, by weight of the maleimide or vinyl compound, or a combination of both maleimide and vinyl compounds (excluding any filler). The free radical curing mechanism gives a fast cure and provides the composition with a long shelf life before cure. Preferred free-radical initiators include peroxides, such as butyl peroctoates and dicumyl peroxide, and azo compounds, such as 2,2'-azobis(2-methyl-propanenitrile) and 2,2'-azobis(2-methyl-butanenitrile).

Alternatively, the underfill encapsulant compositions may contain a photoinitiator in lieu of the free-radical initiator, and the curing process may then be initiated by UV radiation. The photoinitiator will be present in an amount of 0.1 to 10 percent, preferably 0.1 to 3.0 percent, by weight of the maleimide or vinyl compound, or a combination of both maleimide and vinyl compounds (excluding any filler). In some cases, both photoinitiation and free-radical initiation may be desirable. For example, the curing process can be started by UV irradiation, and in a later processing step, curing can be completed by the application of heat to accomplish a free-radical cure.

In general, these compositions will cure within a temperature range of 80° to 180° C., and curing will be effected within a length of time of 5 minutes to 4 hours. As will be understood, the time and temperature curing profile for each encapsulant composition will vary, and different compositions can be designed to provide the curing profile that will be suited to the particular industrial manufacturing process.

Ease of application, even when thermoplastic properties are desired for the underfill encapsulant, is achieved by using relatively low molecular weight reactive oligomers or pre-polymers and curing these in situ after application to the electronic assembly of component and substrate. Applying the materials in an uncured state gives high processibility, and the resultant cured thermoplastic encapsulant provides high mechanical performance.

For some underfill operations, inert inorganic fillers are used in the underfill encapsulant to adjust the coefficient of thermal expansion to more closely mirror that of the circuit interconnect, and to mechanically reinforce the interconnect. Examples of suitable thermally conductive fillers include silica, graphite, aluminum nitride, silicon carbide, boron nitride, diamond dust, and clays. The fillers will be present typically in an amount of 20–80 percent by weight of the total underfill encapsulant composition.

As used throughout this specification: the notation C(O) refers to a carbonyl group.

Maleimide Compounds

The maleimide compounds suitable for use in the underfill encapsulant compositions of this invention have a structure represented by the formula:
$[M-Ar_m]_n-Q$, or by the formula: $[M-Z_m]_n-Ar$. For these specific formulae, when lower case "n" is the integer 1, the compound will be a mono-functional compound; and when lower case "n" is an integer 2 to 6, the compound will be a poly-functional compound.

Formula $[M-Ar_m]_n-Q$ represents those compounds in which:

M is a maleimide moiety having the structure

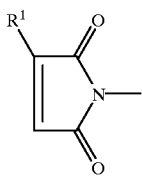

in which $R^1$ is H or $C_1$ to $C_5$ alkyl;

each X independently is an aromatic group selected from the aromatic groups having the structures (I) through (V):

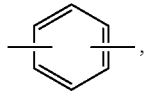 (I)

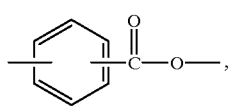 (II)

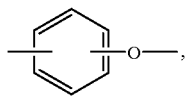 (III)

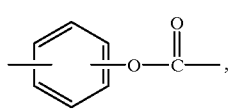 (IV)

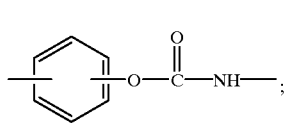 (V)

and Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to X;

or Q is a urethane having the structure:

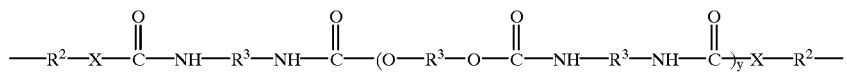

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Q is an ester having the structure:

$$-R^3-\overset{O}{\underset{\|}{C}}-O-R^3-O-\overset{O}{\underset{\|}{C}}-R^3-$$

in which $R^3$ is an alkyl or alkyloxy chain having up to 100 atoms in the chain, which chain may contain aryl substituents;

or Q is a siloxane having the structure:
$-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms and the $R^4$ substituent independently for each position is an alkyl group) having 1 to 5 carbon atoms or an aryl group, and e and g are independently 1 to 10 and f is 1 to 50; and m is 0 or 1, and n is 1 to 6.

Preferably, Ar is structure (II), (III), (IV) or (V), and more preferably is structure (II).

Preferably, Q is a linear or branched chain alkyl, alkyloxy, alkylene, or alkyleneoxy species having up to about 100 atoms in the chain, as described with pendant saturated or unsaturated cyclic or heterocyclic substituents, or a siloxane as described, and more preferably is a linear or branched chain alkyl species or siloxane, as described.

Formula $[M-Z_m]_n-Ar$ represents those compounds in which

M is a maleimide moiety having the structure

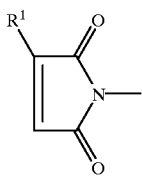

in which $R^1$ is H or $C_1$ to $C_5$ alkyl;

Z is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to K;

or Z is a urethane having the structure:

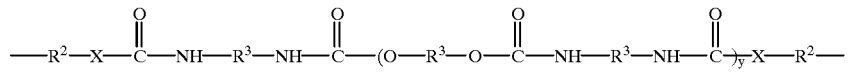

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Z is an ester having the structure:

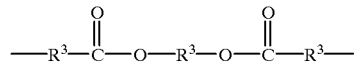

in which $R^3$ is an alkyl or alkyloxy chain having up to 100 atoms in the chain, which chain may contain aryl substituents;

or Z is a siloxane having the structure: $-(CR^1_2)_e-[SiR^4_2-O]_f-SiR^4_2-(CR^1_2)_g-$ in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50;

Ar is an aromatic group selected from the aromatic groups having the structures (VI) through (XIII) (although only one bond may be shown to represent connection to the aromatic group Ar, this will be deemed to represent any number of additional bonds as described and defined by n):

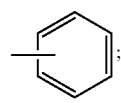
(VI)

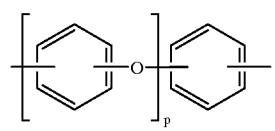
(VII)

in which p is 1 to 100;

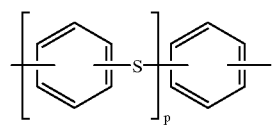
(VIII)

in which p is 1 to 100;

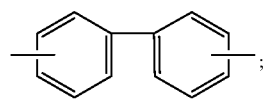
(IX)

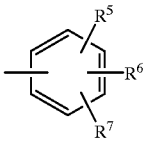
(X)

in which $R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure $-(CR^1_2)_e-[SiR^4_2-O]_f-SiR^4_2-(CH_3)_g-$ in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50;

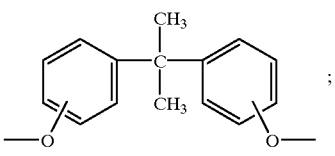
(XI)

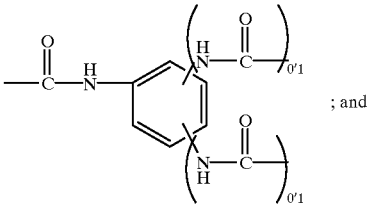
(XII)

; and

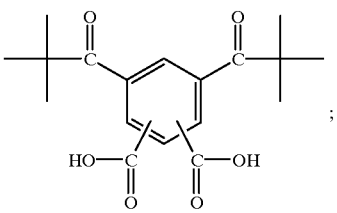
(XIII)

and m is 0 or 1, and n is 1 to 6.

Preferably, Z is a linear or branched chain alkyl, alkyloxy, alkylene, or alkyleneoxy species having up to about 100 atoms in the chain, as described with pendant saturated or unsaturated cyclic or heterocyclic substituents, or a siloxane as described, and more preferably is a linear or branched chain alkyl species or siloxane, as described.

Preferably, Ar is structure (VIII), (X) or (XI), more preferably is structure (X) or (XI), and most preferably is structure (X).

The more preferred maleimide compounds, particularly for use as reworkable encapsulants, are N-butylphenyl maleimide and N-ethylphenyl maleimide.

Vinyl Compounds

The vinyl compounds (other than the maleimides) herein will have the structure:

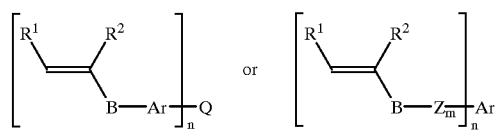

For these specific structures, when lower case "n" is the integer 1, the compound will be a mono-functional compound; and when lower case "n" is an integer 2 to 6, the compound will be a poly-functional compound.

In these structures, $R^1$ and $R^2$ are H or an alkyl having 1 to 5 carbon atoms, or together form a 5 to 9 membered ring with the carbons forming the vinyl group; B is C, S, N, O, C(O), O—C(O), C(O)—O, C(O)NH or C(O)N($R^8$), in which $R^8$ is $C_1$ to $C_5$ alkyl; m is 0 or 1; n is 1–6; and Ar, Q, Z, and Ar are as described above.

Preferably, B is O, C(O), O—C(O), C(O)—O, C(O)NH or C(O)N($R^8$); more preferably B is O, C(O), O—C(O), C(O)—O, or C(O)N($R^8$).

Other Composition Components

Depending on the nature of the substrate, the underfill encapsulant may also contain a coupling agent. A coupling agent as used herein is a chemical species containing a polymerizable functional group for reaction with the maleimide and other vinyl compound, and a functional group capable of condensing with metal hydroxides present on the surface of the substrate. Such coupling agents and the preferred amounts for use in compositions for particular substrates are known in the art. Suitable coupling agents are silanes, silicate esters, metal acrylates or methacrylates, titanates, and compounds containing a chelating ligand, such as phosphine, mercaptan, and acetoacetate. When present, coupling agents typically will be in amounts up to 10 percent by weight, and preferably in amounts of 0.1–3.0 percent by weight, of the maleimide and other monofunctional vinyl compound.

In addition, the encapsulants may contain compounds that lend additional flexibility and toughness to the resultant cured composition. Such compounds may be any thermoset or thermoplastic material having a Tg of 50° C. or less, and typically will be a polymeric material characterized by free rotation about the chemical bonds, such as can be obtained by the presence of carbon-carbon double bonds adjacent to carbon-carbon single bonds, the presence of ester and ether groups, and the absence of ring structures. Suitable such modifiers include polyacrylates, poly(butadiene), polyTHF (polymerized tetrahydrofuran), CTBN (carboxy-terminated butyronitrile) rubber, and polypropylene glycol. When present, toughening compounds may be in an amount up to about 15 percent by weight of the maleimide and other monofunctional vinyl compound.

If siloxane moieties are not part of the maleimide compound structure, siloxanes can be added to the underfill formulations to impart elastomeric properties. Suitable siloxanes are the methacryloxypropyl-terminated polydimethyl siloxanes, and the aminopropyl-terminated polydimethylsiloxanes, available from United Chemical Technologies.

Other additives, such as adhesion promoters, may also be added as needed. The kinds and amounts of adhesion promoters that may be used are known to those skilled in the art.

EXAMPLES

Various maleimide and vinyl compounds were prepared and formulated into encapsulant compositions. The compositions were investigated for viscosity and thixotropic index for the uncured composition, and for curing profile, glass transition temperature, coefficient of thermal expansion, thermal mechanical analysis, and reworkability for the cured composition.

Example 1

Preparation of Benzamido-endcapped Dimer Diamine Bismaleimide

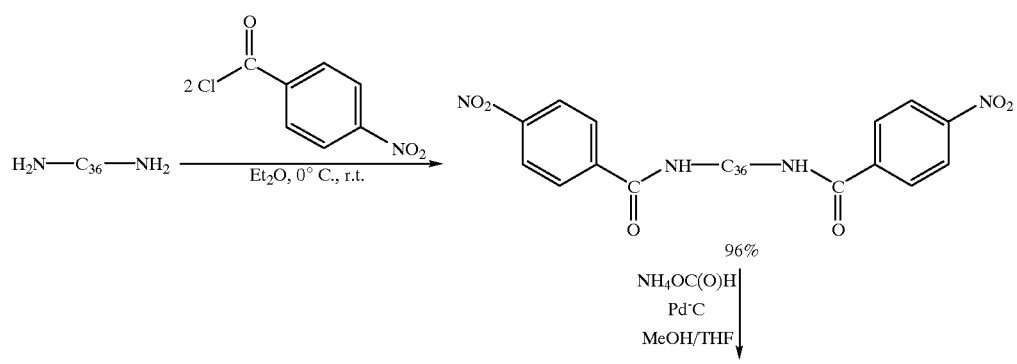

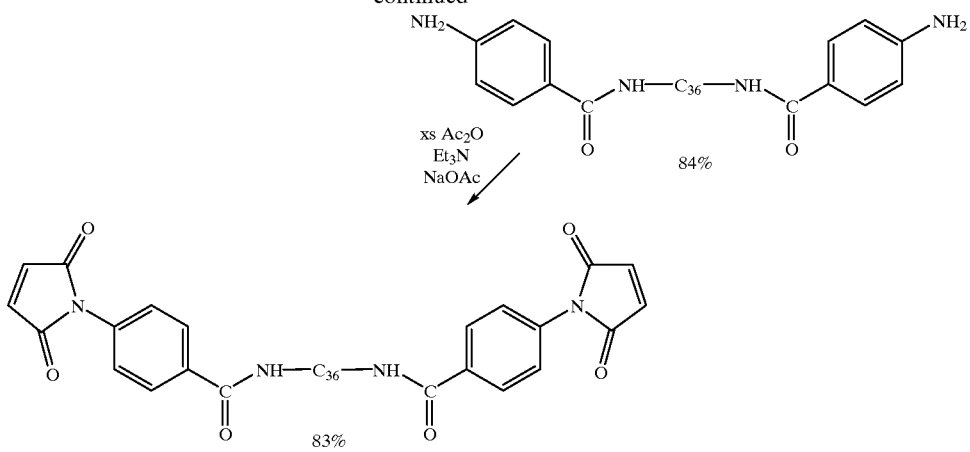

Dimer diamine (sold as Versamine 552 by Henkel, 20.0 g, 37 mmol) was solvated in diethyl ether ($Et_2O$) (200 mL) in a 500 mL three-necked flask equipped with an addition funnel, magnetic stirring, internal temperature probe and nitrogen inlet/outlet. $NaOH_{aq}$ (11.7 mL of 6.25 M solution diluted with 100 mL $H_2O$, 73 mmol) was added with vigorous stirring. This solution was placed under a steady flow of nitrogen and cooled to 3° C. on an ice bath with stirring. The addition funnel was charged with p-nitrobenzoyl chloride (13.6 g, 73 mmol) in $Et_2O$ (50 mL), and this solution was added to the reaction vessel over the course of 60 minutes, maintaining an internal T<10° C. The reaction was stirred at ~3° C. for an additional 60 minutes after this addition was complete, then allowed to warm to room temperature and stirred for another 4 hours. The solution was transferred to a separatory funnel and the isolated organic layer washed with distilled $H_2O$ (300 mL), 5% $HCl_{aq}$ (300 mL), $NaCl_{aq}$ (250 mL) and distilled $H_2O$ (2×250 mL). The organics were isolated, dried over $MgSO_4$ anhyd., filtered and the solvent removed in vacuo to yield the dinitro compound as a viscous yellow oil which exhibited acceptable $^1H$ NMR and IR spectra (30.0 g, 96%).

The dinitro compound described above (5.0 g, 5.9 mmol) was dissolved in methanol (MeOH) (25 mL) and tetrahydrofuran (THF) (5 mL) in a 250 mL three-necked flask equipped with magnetic stirring, reflux condensor and nitrogen inlet/outlet. The solution was placed under nitrogen, and 5% Pd—C (0.96 g) were added with stirring. Ammonium formate (3.4 g, 55 mmol) was added and the reaction stirred at room temperature for 2 hours. Carbon dioxide evolution was immediately observed. The reaction solution was filtered, and bulk filtrate solvent was removed via rotary evaporator. The resulting viscous oil was dissolved in $Et_2O$ (150 mL), washed with distilled $H_2O$ (150 mL), isolated and dried over $MgSO_4$ anhyd. Solvent was removed in vacuo to yield the diamine as a sticky tan oil, which exhibited acceptable $^1H$ NMR and IR spectra (3.9 g, 84%).

Maleic anhydride (0.5 g, 5.1 mmol) was dissolved in acetone (10 mL) in a 250 mL three-necked flask equipped with magnetic stirring, addition funnel and nitrogen inlet/outlet. The solution was cooled on an ice bath and placed under nitrogen. The addition funnel was charged with an acetone (10 mL) solution of the diamine described above (2.0 g, 2.60 mmol), which was added dropwise over 30 minutes. The reaction was stirred for an additional 30 minutes on the ice bath, then allowed to warm to room temperature, and stirred for another 4 hours. To the resulting slurry was added acetic anhydride ($Ac_2O$) (1.54 mL, 160 mmol), triethyl amine ($Et_3N$) (0.23 mL, 1.63 mmol) and sodium acetate (NaOAc) (0.16 g, 1.9 mmol). The resulting slurry was heated to mild reflux for 5 hours. The reaction was allowed to cool to room temperature, and solvent removed via rotary evaporator to yield a brown oil. This material was dissolved in $CH_2Cl_2$ (250 mL) and washed with distilled $H_2O$ (200 mL), satd. $NaHCO_3$ (200 mL) and distilled $H_2O$ (200 mL). Emulsions were broken by adding NaCl when necessary. The organic layer was isolated, dried over $MgSO_4$ anhyd. and solvent removed in vacuo to yield the bismaleimide, a brown solid (2.0 g, 83%). The resin exhibited satisfactory $^1H$ NMR, $^{13}C$ NMR and IR spectra, which indicated slight contamination with acetic acid.

Example 2

Preparation of 20-Bismaleimido-10,11-dioctyl-eicosame (and isomers)

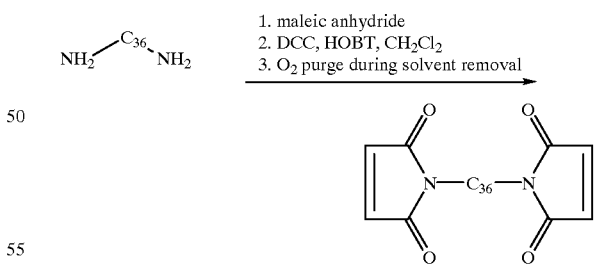

In a 5 L multi-neck flask equipped with a drying tube, thermometer, slow addition funnel, mechanical stirrer and nitrogen purge maleic anhydride (98.06 g, 1.02 equivalents on —$NH_2$) was dissolved in 500 ml tetrahydrofuran (THF). Stirring was begun and the solution was chilled with a dry ice/water bath. Slow addition of dimer diamine (Versamine 552, Henkel, 245.03 g, 0.4477 mol) in 250 ml THF was begun. Addition was carried out over 1 hour. After addition was complete the ice bath was removed and 375 ml of THF was rinsed through the slow addition funnel to incorporate solidified diamine. After one hour the ice bath was replaced around the flask. 1-Hydroxybenzotriazole (96.79 g, 0.80 equivalents on —NH$_2$) was added rinsing into the flask with 50 ml THF. When the temperature had reached 5° C. slow addition of dicyclohexylcarbodiimide (DCC) (188.43 g, 1.02 equivalents on —NH$_2$) in 200 ml THF was begun. The temperature during addition was kept below ten degrees. After DCC addition was complete the slow addition funnel was rinsed with 80 ml of THF. The ice bath was removed. The reaction was monitored by IR. When it appeared that the isoimide has been converted to maleimide (approximately 4 hours after the completion of DCC addition) the mixture was filtered, rinsing the solids with THF. The orange solution was placed in the freezer overnight.

The solution was removed from the freezer and allowed to warm to room temperature. Hydroquinone (0.0513 g) was added to the solution. A partial strip of the THF was carried out on a rotary evaporator with the temperature maintained below 28° C. The solution was concentrated to approximately 800 ml. Much particulate matter was visible. The solution was placed in freezer overnight.

The material was removed from the freezer. Two layers were apparent. The upper layer was clear and yellow in color. The bottom layer was a orange and cloudy. The material was poured cold into a separatory funnel. The top layer was hexane and the desired product. The bottom layer was extracted with hexane (6×200 ml), separation occurred easily. The combined extracts were dried over anhydrous magnesium sulfate and filtered, rinsing the solids with hexane. The solvent was stripped to an approximate volume of 750 ml on a rotary evaporator with the temperature not exceeding 24° C. The remaining solvent was stripped off using a vacuum/air bubbling set-up at room temperature to give the desired product in 67% yield.

Example 3

Preparation of Butadiene-Acrylonitrile Bismaleimide

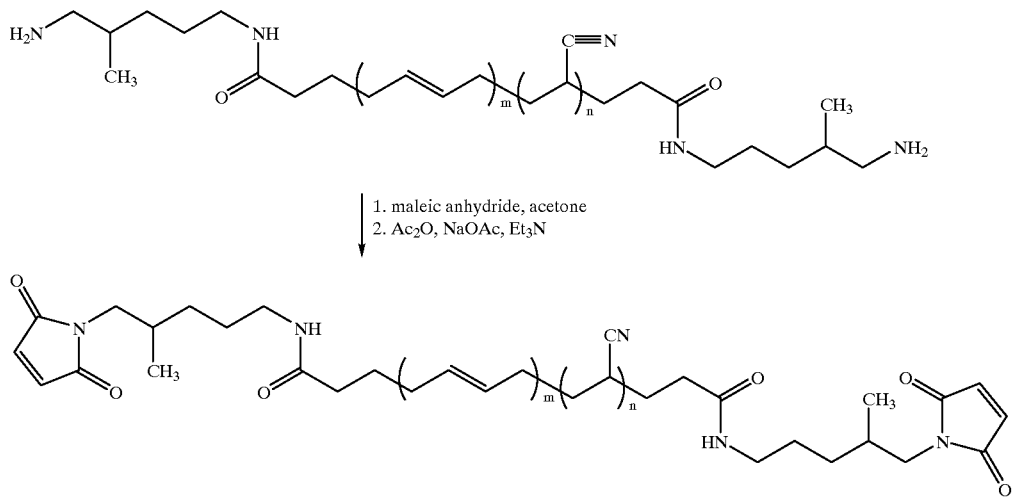

The mixture was removed from the freezer and allowed to warm. The solids were filtered, rinsing with THF. The filtrate was transferred to a 2 L multi-neck flask equipped with a mechanical stirrer, vacuum line connected to a trap, and a glass tube attached by tubing to a drying tube. The remaining THF was stripped at room temperature by pulling a vacuum and bubbling air through the material while stirring. The resultant thick, creamy-tan colored semi-solid was placed in the freezer overnight.

The semi-solid was removed from the freezer and allowed to warm. The semi-solid was dissolved in 450 ml each of methanol and hexane, and washed with 50% methanol/water (4×250 ml) to remove 1-hydroxybenzotriazole (HOBT). It was attempted to extract the product with hexane. After addition of 300 ml of hexane separation was not observed. The mixture was washed with additional water (3×250 ml). The organic phase was placed in the freezer overnight.

Amino-terminated butadiene-acrylonitrile (sold as Hycar resin 1300 X42 ATBN by BF Goodrich, in which the m and n depicted in the structure are integers to provide a number average molecular weight of 3600) (450 g, 500 mmol based on amine equivalent weight AEW=450 g) was dissolved in CHCl$_3$ (1000 mL) in a 3 L four-necked flask equipped with addition funnel, mechanical stirrer, internal temperature probe and nitrogen inlet/outlet. The stirred solution was placed under nitrogen and cooled on an ice bath. The addition funnel was charged with maleic anhydride (98.1 g, 1 mol) in CHCl$_3$ (50 mL) and this solution was added to the reaction over 30 minutes, maintaining the internal reaction temperature below 10° C. The resulting slurry was stirred for 30 minutes on ice, then allowed to warm to room temperature and stirred for an additional 4 hours. To the resulting slurry was added acetic anhydride (Ac$_2$O) (653.4 g, 6 mol), triethyl amine (Et$_3$N) (64.8 g, 0.64 mol) and sodium acetate (NaOAc) (62.3 g, 0.76 mol). The reaction was heated to mild reflux for 5 hours, allowed to cool to room temperature, and subsequently extracted with H$_2$O (1 L), satd. NaHCO$_3$ (1 L)

Example 4

Preparation of Tris(maleimide) Derived from Tris(epoxypropyl)isocyanurate

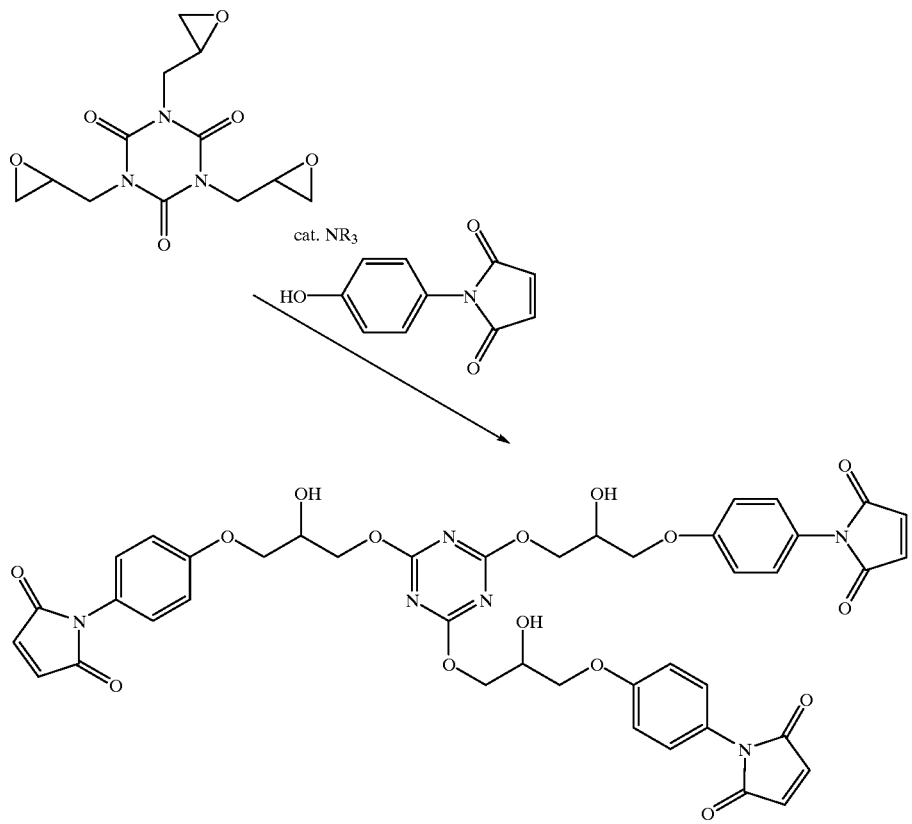

Tris(epoxypropyl)isocyanurate (99.0 g, 0.33 mol) is dissolved in THF (500 mL) in a 2 L three-necked flask equipped with mechanical stirrer, internal temperature probe and nitrogen inlet/outlet. To this solution is added hyroxyphenylmaleimide (189.2 g, 1 mol) and benzyldimethylamine (1.4 g, 0.05 wt. %). The solution is heated to 80° C. for 7 hours. The reaction is allowed to cool to room temperature, is filtered, and the filtrant washed with 5% $HCl_{aq}$ 00 mL) and distilled $H_2O$ (1 L). The resulting solid, triazinetris(maleimide), is vacuum dried at room temperature.

Example 5

Preparation of Maleimidoethylpalmitate

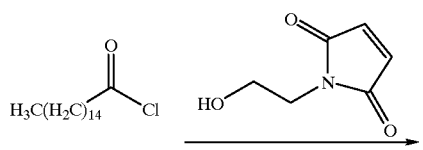

-continued

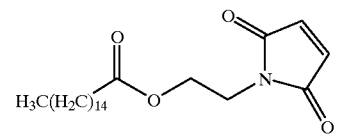

Palmitoyl chloride (274.9 g, 1 mol) is dissolved in $Et_2O$ (500 mL) in a 2 L three-necked flask equipped with mechanical stirrer, internal temperature probe, addition funnel and nitrogen inlet/outlet. $NaHCO_3$ (84.0 g, 1 mol) in distilled $H_2O$ (500 mL) is added with vigorous stirring and the solution cooled on an ice bath under nitrogen. The addition funnel is charged with hydroxyethylmaleimide (141 g, 1 mol) in $Et_2O$ (100 mL) and this solution added to the reaction over a period of 30 minutes, maintaining an internal T<10° C. during the addition. The reaction is stirred for another 30 minutes on ice, then allowed to warm to room temperature and stirred for 4 hours. The reaction is transferred to a separatory funnel and the isolated organic layer washed with distilled $H_2O$ (500 mL), 5% $HCl_{aq}$ (500 mL) and distilled $H_2O$ (2×500 mL). The organics are isolated, dried over $MgSO_4$ anhyd., filtered and solvent removed in vacuo to yield the aliphatic maleimide.

(from previous page:)
and $H_2O$ (2×1 L). Solvent was removed in vacuo to yield the maleimide terminated butadiene acrylonitrile.

Example 6

Preparation of Bismaleimide Derived from 5-Isocyanato-1-(isocyanatomethyl)-1,3,3-trimethylcyclohexane

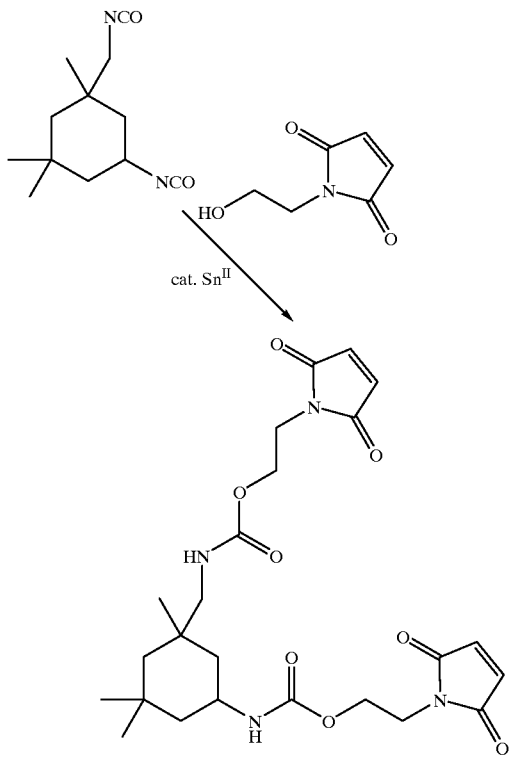

5-Isocyanato-1-(isocyanatomethyl)-1,3,3-trimethylcyclohexane (111.15 g, 0.5 mol) is solvated in THF (500 mL) in a 1 L three-necked flask equipped with mechanical stirrer, addition funnel and nitrogen inlet/outlet. The reaction is placed under nitrogen, and dibutyltin dilaurate (cat. $Sn^{II}$) (6.31 g, 10 mmol) added with stirring as the solution is heated to 70° C. The addition funnel is charged with hydroxyethylmaleimide (141 g, 1 mol) dissolved in THF (100 mL). This solution is added to the isocyanate solution over 30 minutes, and the resulting mixture heated for an additional 4 hours at 70° C. The reaction is allowed to cool to room temperature and solvent removed in vacuo. The remaining oil is dissolved in $CH_2Cl_2$ (1 L) and washed with 10% $HCl_{aq}$ (1 L) and distilled $H_2O$ (2×1 L). The isolated organics are dried over $MgSO_4$, filtered and the solvent removed in vacuo to yield the maleimide.

Example 7

Preparation of Dimer Divinyl Ether Derived from Dimerized Oleic Acid Diol

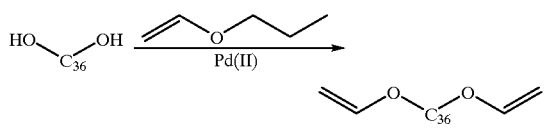

Bis(benzonitrile)palladium chloride (1.15 g, 5 mmol) is dissolved in a mixture of propyl vinyl ether (24.4 g, 3 mol) and oleic acid dimer diol (sold as Pripol 2033 by Unichema, 284.4 g, 500 mmol) in 2 L three-necked flask equipped with a mechanical stirrer under nitrogen. The solution is stirred for three days at room temperature, and then poured onto activated carbon (20 g) and stirred for 1 hour. The resulting slurry is filtered, and excess propyl vinyl ether removed in vacuo to yield the divinyl ether as a yellow oil.

Example 8

Preparation of Dimer Diacrylate Derived from Dimerized Oleic Acid Diol

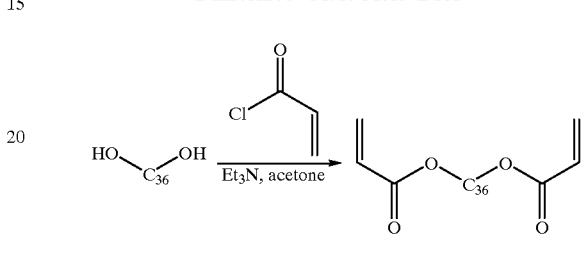

Oleic acid dimer diol (sold as Pripol 2033 by Unichema, 284.4 g, 500 mmol) is dissolved in dry acetone (500 mL) in a 1 L three-necked flask equipped with mechanical stirrer, addition funnel and internal temperature probe under nitrogen. Triethylamine (101.2 g, 1 mol) is added to this solution and the solution cooled to 4° C. on an ice bath. Acryloyl chloride (90.5 g, 1 mol) solvated in dry acetone (100 mL) is charged into the addition funnel and added to the stirred reaction solution over the course of 60 minutes, maintaining an internal temperature <10° C. This solution is stirred on ice for an additional 2 hours, then allowed to warm to room temperature and stirred for 4 hours. Bulk solvent is removed via a rotary evaporator, and the remaining residue solvated in $CH_2Cl_2$ (1 L). This solution is washed with 5% $HCl_{aq}$ (800 mL), and $H_2O$ (2×800 mL). The isolated organics are dried over $MgSO_4$ anhyd. and filtered, and the solvent removed in vacuo to yield the diacrylate as an oil.

Example 9

Preparation of N-ethylphenyl Maleimide

4-Ethyl aniline (12.12g) was dissolved in 50 ml of anhydrous ethyl ether and slowly added to a stirred solution of 9.81 g of maleic anhydride in 100 ml of anhydrous ethyl ether chilled in an ice bath. After completion of the addition, the reaction mixture was stirred for 30 minutes. The light yellow crystal was filtered and dried. Acetic anhydride (200 ml) was used to dissolve the maleamic acid and 20 g of sodium acetate. The reaction mixture was heated in an oil bath at 160° C. After 3 hours of reflux, the solution was cooled to room temperature, placed in a 1 L beaker in ice water and stirred vigorously for 1 hour. The product was suction-filtered and recrystallized in hexane. The collected crystalline material was dried at 50° C. in a vacuum oven overnight. FTIR and NMR analysis showed the characteristics of ethyl maleimide.

Example 10

Preparation of Bis(alkenylsulfide)

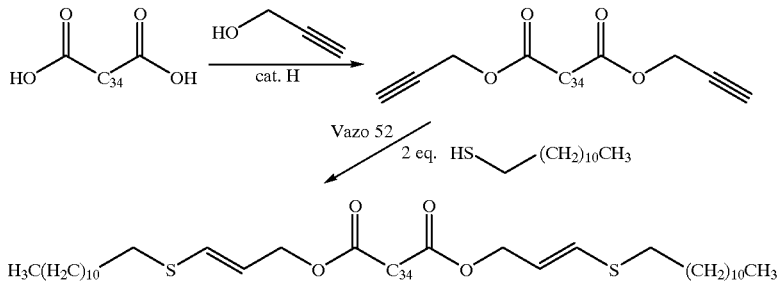

Dimer acid (sold under the trademark Empol 1024 by Unichema) (574.6 g, 1 mol) and propargyl alcohol (112.1 g, 2 mol) were solvated in toluene (1 L) in a 3 L three-necked flask equipped with mechanical stirring and a Dean-Stark distillation apparatus. Concentrated $H_2SO_4$ (6 mL) was added and the solution refluxed for 6 hours until 36 mL of $H_2O$ was azeotropically distilled. The solution was allowed to cool to room temperature, washed with $H_2O$ (2×1 L), dried over $MgSO_4$ anhyd. and solvent removed in vacuo to yield the propargyl ester intermediate as an oil.

This ester intermediate (650.7 g, 1 mol) was solvated in THF (200 mL) in a 1 L three-necked flask equipped with reflux condensor, mechanical stirrer and internal temperature probe under nitrogen. Lauryl mercaptan (404.8 g, 2 mol) and 2,2'-azobis(2,4-dimethylpentanenitrile) (sold under the trademark Vazo 52 by DuPont, 11 g) were added and the resulting mixture heated to 70° C. on an oil bath with stirring for 7 hours. The reaction was allowed to cool to room temperature and solvent removed in vacuo to yield the mercaptan as an oil.

Example 11

Underfill Encapsulant Compositions

Underfill encapsulant compositions were prepared by mixing together the organic components and then by blending the components with a silica filler under high shear until homogeneous. The resulting compositions were light yellow slurries. The viscosities were measured by a Brookfield Viscometer using a 2.54 cm spindle at 0.5 rpm at 25° C. The organic components, silica ratio by weight, Brookfield viscosity and thixotropic index are reported here:

| Composition 11-A: | |
| --- | --- |
| dimethylphenyl maleimide | 20.1 g (0.1 mol) |
| hydroxybutyl vinyl ether | 11.6 g (0.1 mol) |
| aminopropyltrimethoxy silane | 00.32 g (1 wt %) |
| t-butyl perethylhexanoate | 00.32 g (1 wt %) |

The organic components were mixed with silica filler in a ratio of 40% by weight organic components to 60% by weight silica. The Brookfield viscosity was 21000 cp and the thixotropic index was 2.1.

| Composition 11-B: | |
| --- | --- |
| N-ethylphenyl maleimide | 20.1 g (0.1 mol) |
| vinyl t-butylbenzoate | 20.4 g (0.1 mol) |
| aminopropyltrimethoxy silane | 00.4 g (1 wt %) |
| t-butyl perethylhexanoate | |

The organic components were mixed with silica filler in a ratio of 33% by weight organic components to 67% by weight silica. The Brookfield viscosity was 15600 cp and the thixotropic index was 2.1.

| Composition 11-C: | |
| --- | --- |
| N-dodecylphenylmaleimide | 34.1 g (0.1 mol) |
| isobornyl methacrylate | 22.2 g (0.1 mol) |
| aminopropyltrimethoxy silane | 00.56 g (1 wt %) |
| t-butyl perethylhexanoate | |

The organic components were mixed with silica filler in a ratio of 40% by weight organic components to 60% by weight silica. The Brookfield viscosity was 14300 cp and the thixotropic index was 2.5

| Composition 11-D: | |
| --- | --- |
| N-ethylphenyl maleimide | 20.1 g (0.1 mol) |
| N-vinyl caprolactam | 13.9 g (0.1 mol) |
| aminopropyltrimethoxy silane | 00.34 g (1 wt %) |
| t-butyl perethylhexanoate | |

The organic components were mixed with silica filler in a ratio of 39% by weight organic components to 61% by weight silica. The Brookfield viscosity was 21000 cp and the thixotropic index was 2.4.

| Composition 11-E: | |
| --- | --- |
| N-dodecylphenylmaleimide | 34.1 g (0.1 mol) |
| t-butyl styrene | 16.0 g (0.1 mol) |
| aminopropyltrimethoxy silane | 00.5 g (1 wt %) |
| t-butyl perethylhexanoate | |

The organic components were mixed with silica filler in a ratio of 40% by weight organic components to 60% by weight silica. The Brookfield viscosity was 21000 cp and the thixotropic index was 2.3.

Example 12

Coefficient of Thermal Expansion and Glass Transition Region

The coefficient of thermal expansion (CTE) is the change in dimension per unit change in temperature for a given material. Different materials will have different rates of expansion, and rates of expansion for any given material will vary with the temperature. If the CTE is very different for elements attached together, thermal cycling can cause the attached elements to bend, crack, or delaminate. In a typical semiconductor assembly, the CTE of the chip is in the range of 2 or 3 ppm/° C.; for organic circuit board substrate, the CTE is greater than 30 ppm/° C.; and for the solder interconnect, the CTE is 26–28 ppm/° C. In order to reinforce the solder interconnect, the CTE of the underfill encapsulant is best close to that of the solder.

When a polymer is subjected to the application of heat, it will move through a transition region between a hard, glassy state to a soft, rubbery state. This region is known as the glass transition region or Tg. If a graph of expansion of the polymer versus temperature is plotted, the glass transition region is the intersection between the lower temperature/glassy region coefficient of thermal expansion and the higher temperature/rubbery region coefficient of thermal expansion. Above this region, the rate of expansion increases significantly. Consequently, it is preferred that the glass transition of the polymer be higher than normal operating temperatures experienced during the application, and if reworkability is needed, that the glass transition be lower than any rework temperature.

For each of the Compositions 11-A to 11-E, the glass transition temperature (Tg) and the coefficient of thermal expansion (CTE) were measured using Thermal Mechanical Analysis on cured samples. A 2 ml aliquot of each of the Compositions was injected into the 4 mm cavity of a silica/rubber mold and cured to form a resinous cylinder of 4 mm in diameter and 5 mm in height. These samples were heated in a continuum of temperature ranging from –50° C. to 200° C. at a rate of increase in temperature of 5° C./minute. The Tg was measured as the temperature in ° C. at which the sample softened, determined as the breakpoint in the curve of expansion versus temperature. The CTE was measured as the slope of the expansion curve in units of ppm/° C.

The CTE and the Tg for Compositions 10-A to 10-E are reported here:

| Sample | CTE ppm/° C. | Tg° C. |
|--------|--------------|--------|
| 11-A   | 32           | 144    |
| 11-B   | 36           | 165    |
| 11-C   | 37           | 160    |
| 11-D   | 30           | 125    |
| 11-E   | 40           | 110    |

Example 13

Reworkability

Each composition 11-A to 11-E was tested for reworkability when used to bond a 250×250 mil² silicon die to a FR-4 circuit board substrate. A one ml aliquot of underfill sample was blended with 0.002 g of 3 mil glass bead spacers (to take the place of solder or polymer interconnects in an integrated circuit), dispensed between the die and the FR-4 board, and cured at 125° C. for 20 minutes. To rework, the fixture was placed onto a 200° C. hot plate for one minute. The chip was mechanically removed, leaving underfill residue on the FR4 board. The board was cooled to room temperature and methyl isobutyl ketone was used to dissolve and clean the residue from the board. The recovery time for the rework was two minutes. All samples demonstrated reworkability.

As a control, the same procedure was performed using an epoxy based adhesive sold under the tradename Ablebond® XP-11 available from Ablestik Laboratories, Rancho Dominguez, Calif., as the underfill composition. Although the chip could be removed from the board, the residue could not be cleaned without seriously scratching or denting the board.

This Example demonstrates that these compositions can be made to be reworkable and still meet the performance criteria needed for use as underfill encapsulants.

Example 14

Reworkability

In this Example, a 250×250 mil² silicon die was connected to a soldermask-coated substrate using a tin/lead solder. After solder reflow, the underfill compositions 11-A to 1 1-E were individually dispensed along one side of individual dies and the substrate heated to 80° C. to initiate the capillary action to fill the gap between the die and substrate. The assembly was then put into a 150° C. oven for 10 minutes to cure the underfill.

To rework, the assembly was heated on a 200° C. hot plate for one minute, after which the die was mechanically removed from the board. At this temperature, the underfill material had softened and the solder interconnect had melted, leaving residues of both solder and underfill on the board. A sponge swab saturated with methyl ethyl ketone solvent was used to remove the underfill and clean the board until no residual material was observable under an optical microscope.

Example 15

Reworkable Underfill Containing Multi-functional Monomers

An underfill encapsulant composition containing both mono-functional and poly-functional compounds were prepared by mixing together the organic components and then by blending the components with a silica filler under high shear until homogeneous. The resulting compositions were light yellow slurries.

| Composition 15-A | |
|---|---|
| N-4-butylphenyl maleimide | 22.9 g (64.9%) |
| 4-hydroxybutyl vinyl ether | 11.6 g (32.9%) |
| triethylene glycol divinyl ether | 0.2 g (0.57%) |
| methacyloxypropyl trimethoxysilane | 0.3 g (0.85%) |
| dicumyl peroxide | 0.3 g (0.85%). |

The organic components were mixed with silica filler in a ratio of 34% by weight organic components to 66% by weight silica (68.5 g) (sold by Denka, product number FB-6S). The CTE was measured as 34 ppm/° C., Tg is, 135° C. The sample was cured as in Example 13 and no residual material was observable under an optical microscope.

Example 16

UV and Thermally Curable Compositions

Composition 16-A

A underfill encapsulant composition was prepared by combining the following ingredients with vigorous manual mixing until a homogenous paste was obtained:

| | |
|---|---|
| Bismaleimide (prepared from polytetramethylene oxide-di-p-aminobenzoate, sold as Versalink P-650 by Henkel | 1.01 g |
| Cyclohexanedimethanol divinylether (International Specialty Products): | 0.19 g |
| α,α-Dimethoxy-α-phenylacetophenone (sold as Irgacure 651 by Ciba Specialty Chemicals) | 0.06 g |
| Hydrophilic Fused Silica (sold by Denka, ~5 micron) | 3.78 g |

A 250 mil×250 mil silicon die placed on FR-4 laminate was encapsulated with the above paste and irradiated for 30 seconds using a pulsed xenon UV source (RC-500B Pulsed UV Curing System, Xenon Corporation). The encapsulant exhibited a hard, fully cured surface and held the die firmly to the laminate material when force was applied. The sample assembly was subsequently placed in a 175° C. oven for 20 minutes. The encapsulated die was allowed to cool to room temperature and then forcibly removed from the laminate. No regions of uncured encapsulant were detected around the die edge, the laminate/adhesive interface or the adhesive/air surface interface.

Composition 16-B

A underfill encapsulant composition was prepared by combining the following ingredients with vigorous manual mixing until a homogenous paste was obtained:

| | |
|---|---|
| Bismaleimide (prepared from polytetramethylene oxide-di-p-aminobenzoate, sold as Versalink P-650 by Henkel | 1.01 g |
| Cyclohexanedimethanol divinylether (International Specialty Products): | 0.19 g |
| t-Butyl-2-ethylhexanoate | 0.03 g |
| Hydrophilic Fused Silica (sold by Denka, ~5 micron) | 3.78 g |

A 250 mil×250 mil silicon die placed on FR-4 laminate was encapsulated with the above paste and placed in a 150° C. oven for 30 min. The test assembly was allowed to cool to room temperature and the die was forcibly removed from the laminate. No regions of uncured encapsulant were detected around the die edge, the laminate/adhesive interface or the adhesive/air surface interface.

What is claimed is:

1. A curable composition comprising a maleimide compound, and a curing initiator selected from the group consisting of a free-radical initiator, a photoinitiator, and a combination of those, the maleimide compound having the formula:

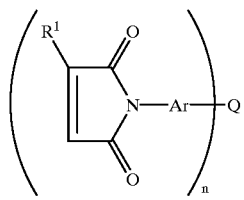

in which n is 1 to 6 and (a) $R^1$ is H or an alkyl group having 1 to 5 carbon atoms;

(b) Ar is an aromatic group selected from the aromatic groups having the structures:

and

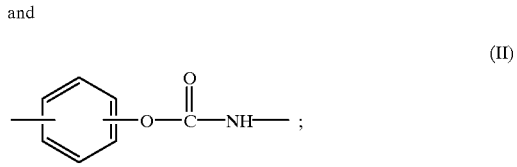

(c) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

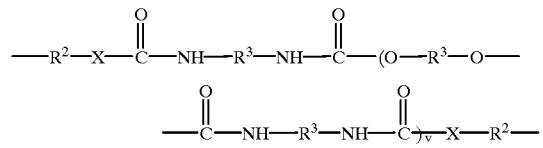

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

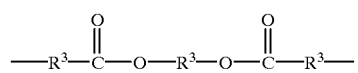

in which $R^3$ is an alkyl or alkyloxy chain having up to 100 atoms in the chain, which chain may contain aryl substituents; or Q is a siloxane having the structure: $—(CR^1_2)_e—(SiR^4_2—O)_f—SiR^4_2—(CR^1_2)_g—$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

2. The curable composition according to claim 1 in which Q is the urethane.

3. A curable composition comprising a maleimide compound, and a curing initiator selected from the group consisting of a free-radical initiator, a photoinitiator, and a combination of those, the maleimide compound having the formula:

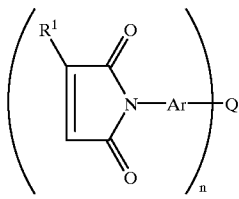

in which n is 1 to 6 and (a) $R^1$ is H or an alkyl group having 1 to 5 carbon atoms;

(b) Ar is an aromatic group selected from the aromatic groups having the structures:

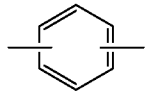   (III)

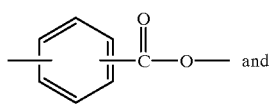 and   (IV)

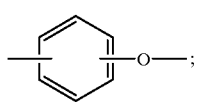;   (V)

(c) Q is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

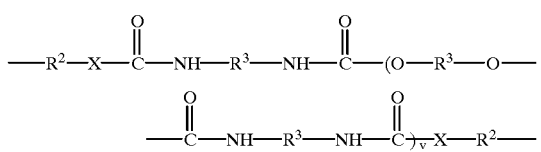

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

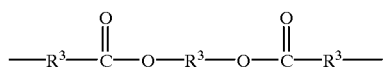

in which $R^3$ is an alkyl or alkyloxy chain having up to 100 atoms in the chain, which chain may contain aryl substituents.

4. The curable composition according to claim 3 in which Q is the urethane.

5. The curable composition according to claim 3 in which Q is the ester.

6. A curable composition comprising a maleimide compound, and a curing initiator selected from the group consisting of a free-radical initiator, a photoinitiator, and a combination of those, the maleimide compound having the formula:

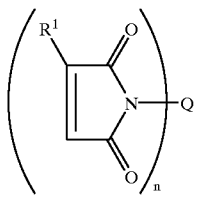

in which n is 1 to 6 and

Q is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain; or Q is a urethane having the structure:

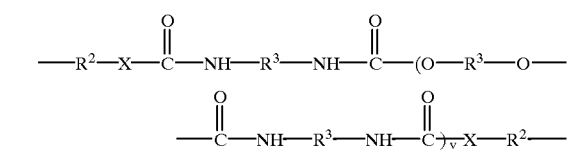

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50.

7. The curable composition according to claim 6 in which Q is the urethane.

8. A curable composition comprising a maleimide compound and a curing initiator selected from the group consisting of a free-radical initiator, a photoinitiator, and a combination of those, the maleimide compound having the formula

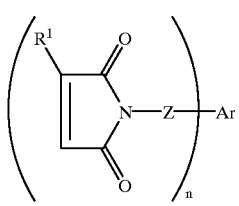

in which (a) R¹ is H or an alkyl having 12 to 5 carbon atoms;

(b) Z is a linear or branched chain alkyl amine, alkyl sulfide, alkylene amine, alkylene sulfide, aryl, aryloxy, or aryl sulfide species having up to about 100 atom in the chain, which may contain saturated or unsaturated cyclic or heterocyclic substituents pendant from the chain or as part of the chain, and in which any heteroatom present may or may not be directly attached to Ar; or Z is a urethane having the structure:

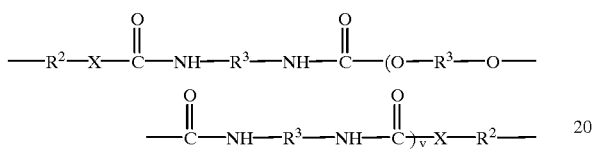

in which each R² independently is an alkyl, aryl, or arylalkyl group having 1 to 18 carbon atoms; R³ is an alkyl or alkyloxy chain having up to 100 atoms in the chain, which chain may contain aryl substituents; X is O, S, N, or P; and v is 0 to 50; or Z is a siloxane having the structure: $—(CR^1_2)_e—[SiR^4_2—O]_f—SiR^4_2—(CR^1_2)_g—$ in which the R¹ substituent independently for each position is H or an alkyl group having 1 to 5 carbon atoms, and the R⁴ substituent independently for each position is an alkyl group having 1 to 5 carbon atoms or an aryl group, and e and g are independently 1 to 10, and f is 1 to 50; or Z is an ester having the structure:

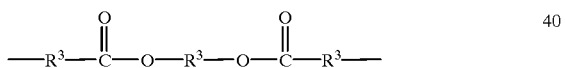

in which R³ is an alkyl or alkyloxy chain having up to 100 atoms in the chain, which chain may contain aryl substituents;

(c) Ar is an aromatic group selected from group of aromatic groups having the structures;

(VI)

(VII)

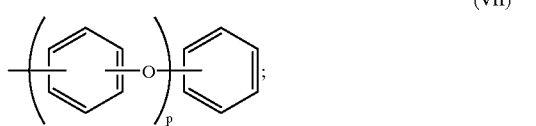

(VIII)

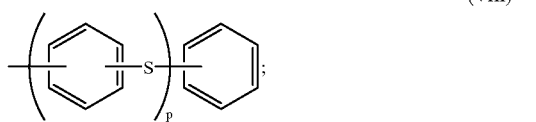

(IX)

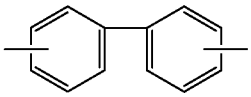

(X)

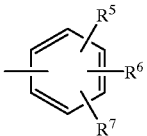

(XI)

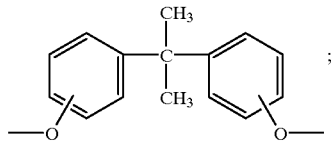

(XII)

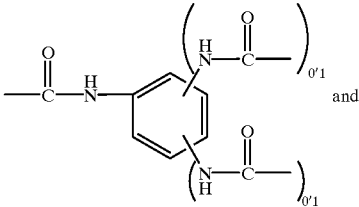
and (XIII)

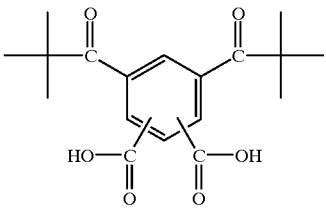

in which
p is 1 to 100;

R⁵, R⁶, and R⁷ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or R⁵, R₆, and R⁷ are a siloxane having the structure $—(CR^1_2)_e—[SiR^4_2—O]_f—R^4_2—(CH_3)_g—$ in which the R¹ substituent is H or an alkyl group having 1 to 5 carbon atoms and the R⁴ substituent independently for each position is an alkyl group having 1 to 5 carbon atoms or an aryl group, and e is 1 to 10 and f is 0 to 50.

9. The curable composition according to claim 8 in which Z is the urethane.

10. The curable composition according to claim 8 in which Z is the siloxane.

11. The curable composition according to claim 8 in which Z is the ester.

12. The curable composition according to any one of claims 8 to 11 in which Ar is (VIII)

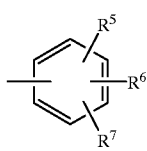

(X)

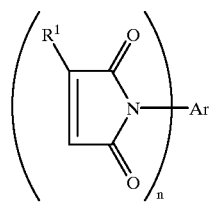  or (XI)

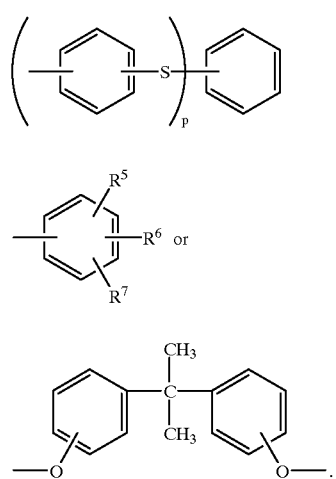

13. A curable composition comprising a maleimide compound and a curing initiator selected from the group consisting of a free-radical initiator, a photoinitiator, and a combination of those, the maleimide compound having the formula

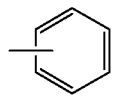

in which (a) $R^1$ is H or an alkyl having 1 to 5 carbon atoms;
(b) Ar is an aromatic group selected from group of aromatic groups having the structures:

(VI)

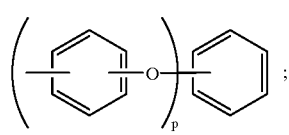

(VII)

(VIII)

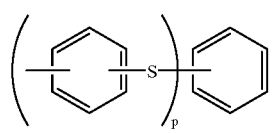

(IX)

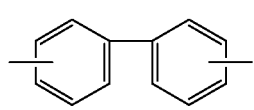

(X)

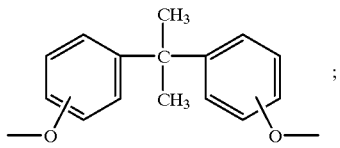

(XI)

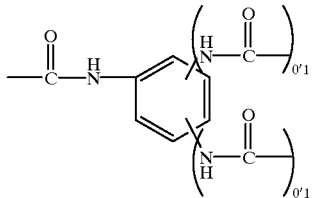

(XII)

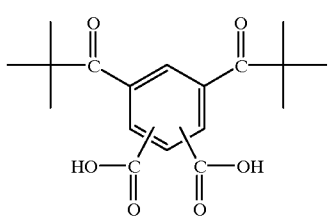   and (XIII)

in which p is 1 to 100;

$R^5$, $R^6$, and $R^7$ are a linear or branched chain alkyl, alkyloxy, alkyl amine, alkyl sulfide, alkylene, alkyleneoxy, alkylene amine, alkylene sulfide, arly, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure $—(CR^1_2)_e—[SiR^4_2—O]_f—R^4_2—(CH_3)_g—$ in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50.

14. The curable composition according to claim 13 in which Ar is (VIII)

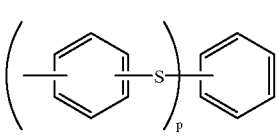

-continued

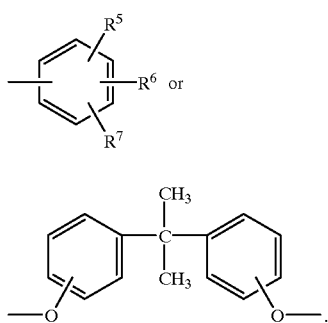
(X)

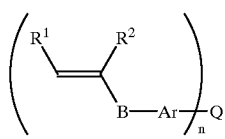
(XI)

15. A curable composition comprising a vinyl compound, and a curing initiator selected from the group consisting of a free-radical initiator, a photoinitiator, and a combination of those, the vinyl compound having the formula

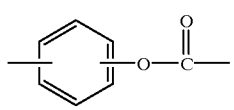

in which n is 1 to 6, and
(a) $R^1$ and $R^2$ are H or an alkyl group having 1 to 5 carbon atoms, or together form a 5 to 9 membered ring with the carbons forming the vinyl group;
(b) B is C, S, N, O, C(O), O—C(O), C(O)—O, C(O)NH or C(O)N($R^B$), in which $R^B$ is an alkyl group having 1 to 5 carbon atoms;

(c) each Ar is an aromatic group selected from the group of aromatic groups having the structures:

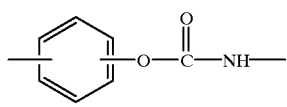
(I)

and

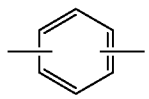
(II)

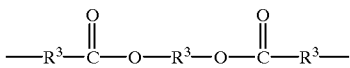
(III)

-continued

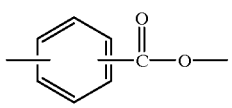
(IV)

and

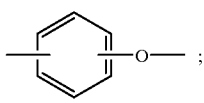
(V)

(d) Q is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

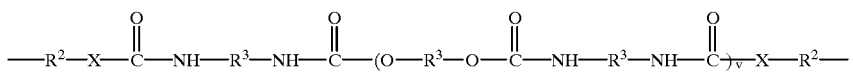

in which each $R^2$ independently is an alkyl, aryl, or arylalkyl group having 1 to 18 carbon atoms: $R^3$ is an alkyl or alkyloxy chain having up to 100 atoms in the chain, which chain may contain aryl substituents; X is O, S, N, or P; and v is 0 to 50; or Q is an ester having the structure:

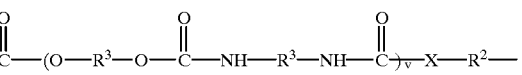

in which $R^3$ is an alkyl or alkyloxy chain having up to 100 atoms in the chain, which chain may contain aryl substituents; or Q is a siloxane having the structure: —$(CR^1{}_2)_e$—$(SiR^4{}_2$—$O)_f$—$SiR^4{}_2$—$(CR^1{}_2)_g$— in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

16. The curable composition according to claim 15 in which Q is the urethane.

17. The curable composition according to claim 15 in which Q is the ester.

18. The curable composition according to claim 15 in which Q is the siloxane.

19. A curable composition comprising a vinyl compound, and a curing initiator selected from the group consisting of a free-radical initiator, a photoinitiator, and a combination of those, the vinyl compound having the formula

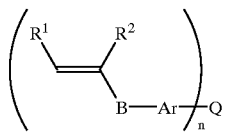

in which n is 1 to 6, and
(a) $R^1$ and $R^2$ are H or an alkyl group having 1 to 5 carbon atoms, or together form a 5 to 9 membered ring with the carbons forming the vinyl group;
(b) B is C, S, N, C(O)NH or C(O)N($R^B$), in which $R^B$ is an alkyl group having 1 to 5 carbon atoms;
(c) Ar is an aromatic group selected from the aromatic groups having the structure:

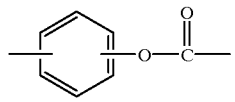 (I)

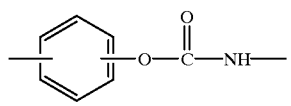 (II)

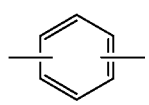 (III)

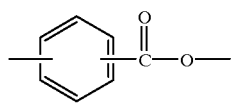 (IV)

and

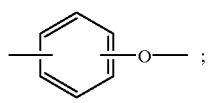 (V)

;

(d) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or
Q is a urethane having the structure:

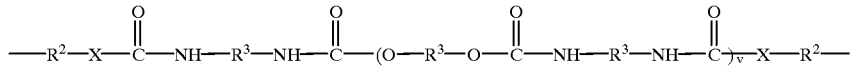

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents: X is O, S, N, or P; and v is 0 to 50; or
Q is an ester having the structure:

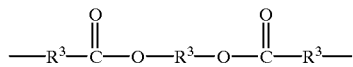

in which $R^3$ is an alkyl or alkyloxy chain having up to 100 atoms in the chain, which chain may contain aryl substituents; or
Q is a siloxane having the structure: $-(CR^1_2)_e-(SiR^4_2-O)_f-SiR^4_2-(CR^1_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

20. The curable composition according to claim 19 in which Q is the urethane.

21. The curable composition according to claim 19 in which Q is the ester.

22. The curable composition according to claim 19 in which Q is the siloxane.

23. A curable composition comprising a vinyl compound, and a curing initiator selected from the group consisting of a free-radical initiator, a photoinitiator, and a combination of those, the vinyl compound having the formula

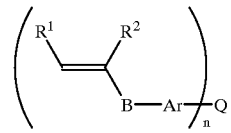

in which n is 1 to 6, and
(a) $R^1$ and $R^2$ are H or an alkyl group having 1 to 5 carbon atoms, or together form a 5 to 9 membered ring with the carbons forming the vinyl group;
(b) B is C, S, N, O, C(O), O—C(O), C(O)—O, C(O)NH or C(O)N($R^B$), in which $R^B$ is an alkyl group having 1 to 5 carbon atoms;
(c) Ar is an aromatic group selected from the aromatic groups having the structures:

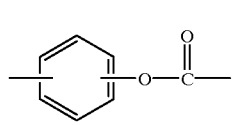 (I)

-continued

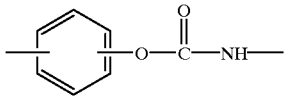  (II)

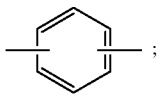  (III);

(d) Q is a linear or branched chain alkyl, alkyloxy, alkyl amine, alkyl sulfide, alkylene, alkylene oxide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or
Q is a urethane having the structure:

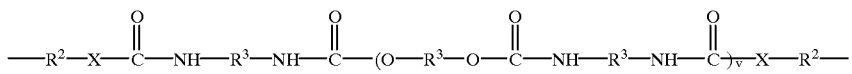

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or
Q is an ester having the structure:

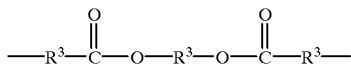

in which $R^3$ is an alkyl or alkyloxy chain having up to 100 atoms in the chain, which chain may contain aryl substituents; or
Q is a siloxane having the structure:

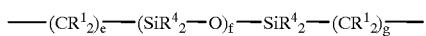

in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

24. The curable composition according to claim 23 in which Q is the urethane.

25. The curable composition according to claim 23 in which Q is the ester.

26. The curable composition according to claim 23 in which Q is the siloxane.

27. A curable composition comprising a vinyl compound, and a curing initiator selected from the group consisting of a free-radical initiator, a photoinitiator, and a combination of those, the vinyl compound having the formula

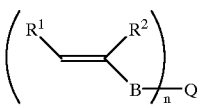

in which n is 1 to 6, and (a) $R^1$ and $R^2$ are H or an alkyl group having 1 to 5 carbon atoms, or together form a 5 to 9 membered ring with the carbons forming the vinyl group;

(b) B is C, S, N, O, C(O), O—C(O), C(O)—O, C(O)NH or C(O)N($R^B$), in which $R^B$ is an alkyl group having 1 to 5 carbon atoms;

(c) Q is a urethane having the structure:

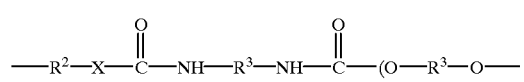

-continued

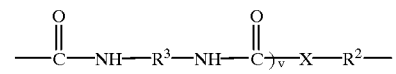

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50.

28. A curable composition comprising a vinyl compound, and a curing initiator selected from the group consisting of a free-radical initiator, a photoinitiator, and a combination of those, the vinyl compound having the formula

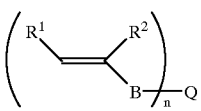

in which n is 1 to 6, and (a) $R^1$ and $R^2$ are H or an alkyl group having 1 to 5 carbon atoms, or together form a 5 to 9 membered ring with the carbons forming the vinyl group;

(b) B is C, S, N, C(O)NH or C(O)N($R^B$), in which $R^B$ is an alkyl group having 1 to 5 carbon atoms;

(c) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or
Q is a urethane having the structure:

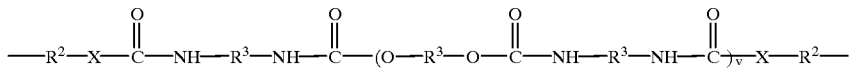

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

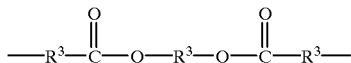

in which $R^3$ is an alkyl or alkyloxy chain having up to 100 atoms in the chain, which chain may contain aryl substituents; or Q is a siloxane having the structure: $-(CR^1_2)_e-(SiR^1_2-O)_f-SiR^4_2-(CR^1_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

29. The curable composition according to claim 28 in which Q is the urethane.

30. The curable composition according to claim 28 in which Q is the ester.

31. The curable composition according to claim 28 in which Q is the siloxane.

32. A curable composition comprising a maleimide compound as described in any one of claims 1 to 14, a vinyl compound as described in any one of claims 15 to 31, and a curing initiator.

33. An electronic assembly comprising an electronic component and a substrate, and a curable composition according to any one of the preceding claims disposed between the electronic component and the substrate.

* * * * *